US012787371B2

(12) United States Patent
Hong et al.

(10) Patent No.: US 12,787,371 B2
(45) Date of Patent: Nov. 3, 2026

(54) TUNNELING FIELD EFFECT TRANSISTOR HAVING BURIED DRAIN STRUCTURE

(71) Applicant: IUCF-HYU (INDUSTRY-UNIVERSITY COOPERATION FOUNDATION HANYANG UNIVERSITY), Seoul (KR)

(72) Inventors: Jin Pyo Hong, Seoul (KR); Min Won Kim, Seoul (KR); Ji Hun Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 324 days.

(21) Appl. No.: 18/713,881

(22) PCT Filed: Nov. 15, 2022

(86) PCT No.: PCT/KR2022/017945
§ 371 (c)(1),
(2) Date: May 28, 2024

(87) PCT Pub. No.: WO2023/096246
PCT Pub. Date: Jun. 1, 2023

(65) Prior Publication Data

US 2025/0318208 A1 Oct. 9, 2025

(30) Foreign Application Priority Data

Nov. 29, 2021 (KR) ........................ 10-2021-0166624

(51) Int. Cl.
*H10D 48/00* (2025.01)

(52) U.S. Cl.
CPC ................................ *H10D 48/383* (2025.01)

(58) Field of Classification Search
CPC ........ H10D 48/30; H10D 64/23; H10D 64/27; H10D 64/66; H10D 12/021; H10D 12/211

(Continued)

(56) References Cited

U.S. PATENT DOCUMENTS

2005/0253167 A1* 11/2005 Wu ........................ H10D 30/87 257/E29.317
2014/0077286 A1* 3/2014 Kubo ..................... H10D 30/60 257/327

(Continued)

FOREIGN PATENT DOCUMENTS

JP 2011-66464 A 3/2011
KR 10-0622675 B1 9/2006

(Continued)

OTHER PUBLICATIONS

International Search Report for PCT/KR2022/017945 dated Feb. 14, 2023.
Written Opinion for PCT/KR2022/017945 dated Feb. 14, 2023.

*Primary Examiner* — Didarul A Mazumder
(74) *Attorney, Agent, or Firm* — Sughrue Mion, PLLC

(57) ABSTRACT

A tunneling field effect transistor having a buried drain structure is provided. The tunneling field effect transistor comprises a semiconductor pattern disposed on a substrate and including a thin part at one end, a thick part at the other end, and a step between the thin part and the thick part. A drain electrode is disposed on the thin part, a source electrode is disposed on the thick part, and a gate electrode is disposed on the thick part between the drain electrode and the source electrode. A gate insulating layer is disposed between the semiconductor pattern and the gate electrode and between a sidewall of the step of the semiconductor (Continued)

pattern and the drain electrode. The semiconductor pattern has a drain region of a first conductivity type induced by generation of a charge plasma of the first conductivity type in an area adjacent to the drain electrode, and a source region of a second conductivity type induced by generation of a charge plasma of the second conductivity type in an area adjacent to the source electrode, and a channel region between the source region and the drain region. A thickness of the drain electrode is lower than a height of the step of the semiconductor pattern.

16 Claims, 6 Drawing Sheets

(58) Field of Classification Search
USPC .......................................................... 257/105
See application file for complete search history.

(56) References Cited

U.S. PATENT DOCUMENTS

| | | | | |
|---|---|---|---|---|
| 2015/0129925 | A1* | 5/2015 | Kondo | H10D 12/021<br>257/105 |
| 2015/0364582 | A1* | 12/2015 | Goto | H10D 12/211<br>257/12 |
| 2016/0240666 | A1* | 8/2016 | Miyata | H10D 12/211 |
| 2016/0322460 | A1* | 11/2016 | Chung | H10D 12/211 |

FOREIGN PATENT DOCUMENTS

| | | | |
|---|---|---|---|
| KR | 10-2008-0006268 | A | 1/2008 |
| KR | 10-1790237 | B1 | 11/2017 |
| KR | 10-1838910 | B1 | 4/2018 |

* cited by examiner

[FIG. 1]
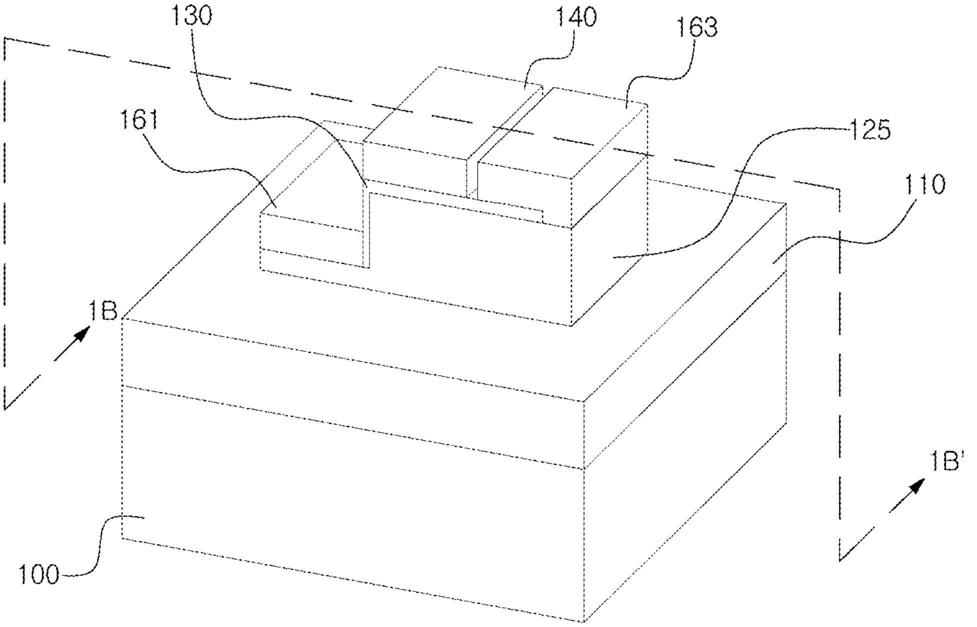

[FIG. 2]
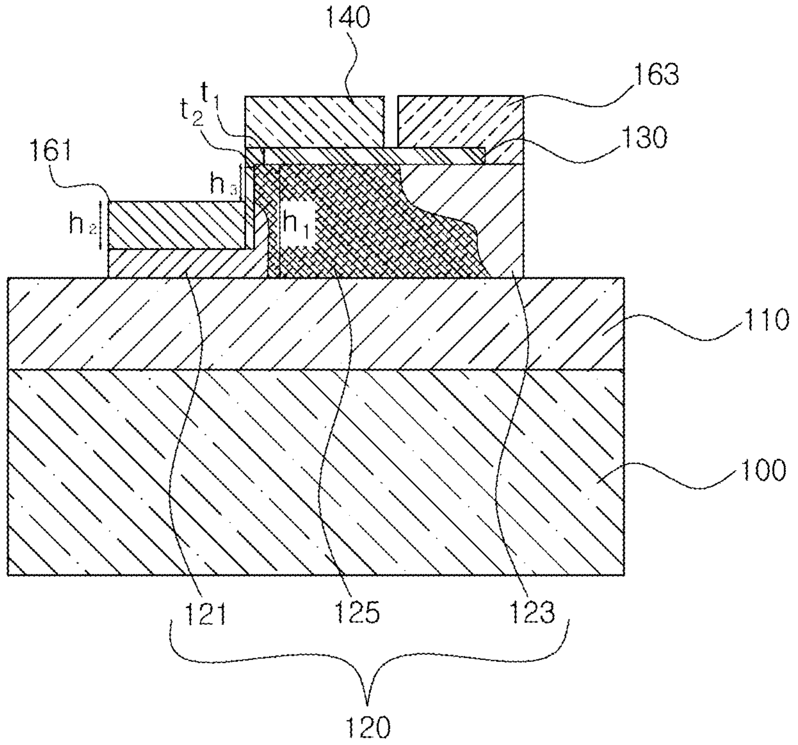

[FIG. 3]
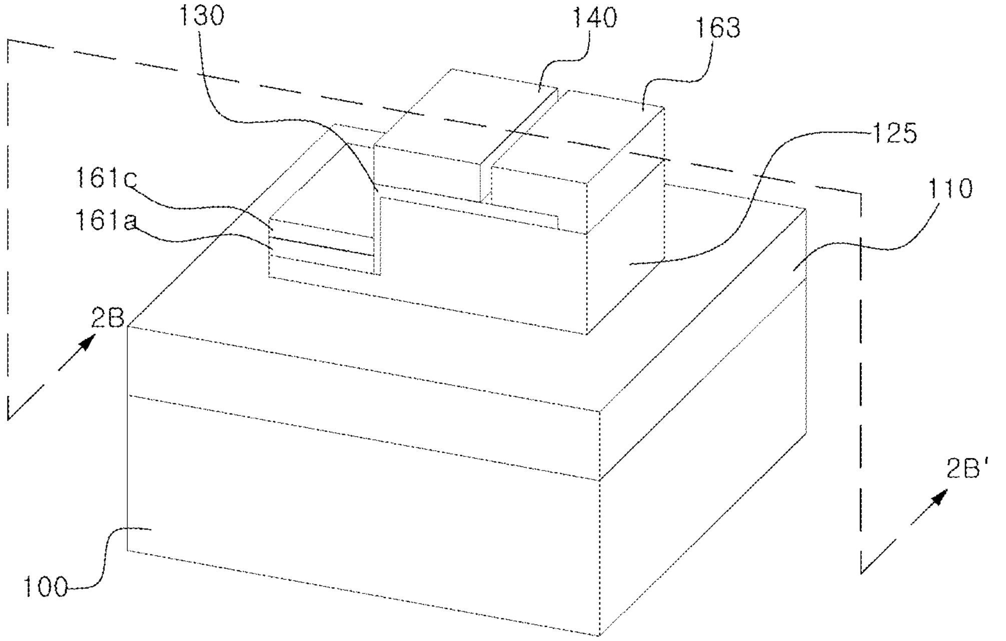

[FIG. 4]
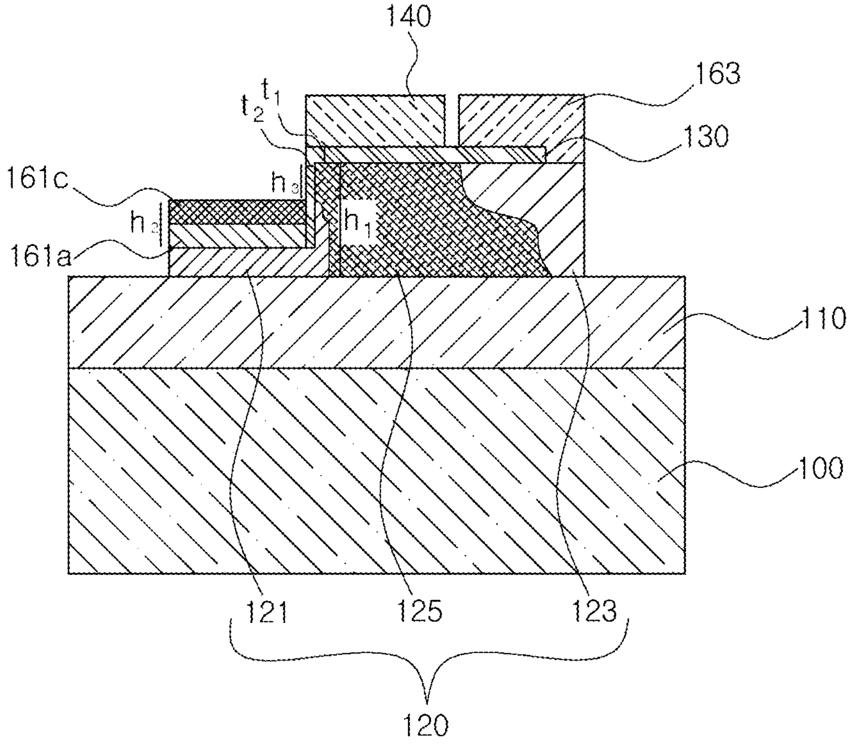

[FIG. 5]
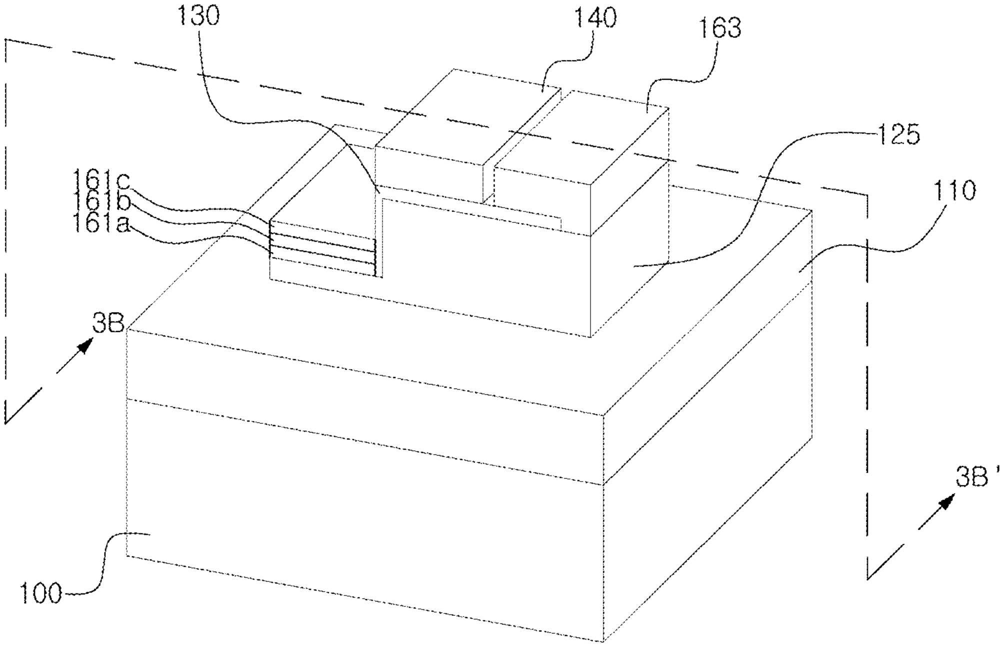

[FIG. 6]
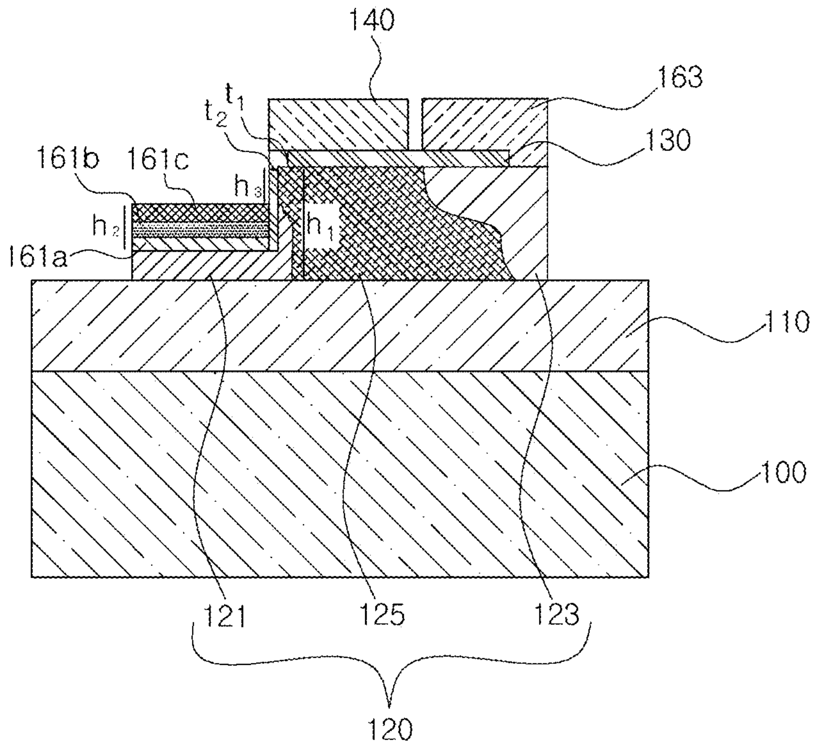

TUNNELING FIELD EFFECT TRANSISTOR HAVING BURIED DRAIN STRUCTURE

CROSS REFERENCE TO RELATED APPLICATIONS

This application is a National Stage of International Application No. PCT/KR2022/017945 filed Nov. 15, 2022, claiming priority based on Korean Patent Application No. 10-2021-0166624 filed Nov. 29, 2021, the disclosure of which is incorporated by reference herein in its entirety.

TECHNICAL FIELD

The present invention relates to semiconductor devices, and more particularly to tunneling field effect transistors.

BACKGROUND ART

Unlike general field effect transistors, tunneling field effect transistors operate using tunneling between source-channel-drain without operations such as depletion or inversion in the channel region. Therefore, tunneling field effect transistors are known to be suitable for low-power devices because they can implement low subthreshold swing.

Taking an n-type transistor among tunneling field effect transistors as an example, when a positive voltage higher than the threshold voltage is applied to the gate electrode, the energy band of the channel region goes down, and the tunneling width between the valence band of the source region and the conduction band of the channel region can be reduced. Accordingly, as electrons tunnel from the valence band of the source region to the conduction band of the channel region, current flows between the source region and the drain region, turning the transistor into an on state.

On the other hand, when a negative voltage is applied to the gate electrode, the energy band of the channel region goes up, and the tunneling width between the valence band of the channel region and the conduction band of the drain region may decrease. Accordingly, electrons tunnel from the valence band of the channel region to the conduction band of the drain region, allowing current to flow between the source region and the drain region. This is called an ambipolar current, and can be defined as a leakage current in a circuit based on an inverter operation where the transistor must remain in the off state when a negative voltage is applied to the gate electrode. This may cause malfunction or power consumption.

DISCLOSURE

Technical Problem

To reduce this ambipolar current, attempts have been made to increase the tunneling width by increasing the in-plane spacing between the gate electrode and the drain electrode. However, in this case, the area occupied by one transistor increases, which may result in a decrease in device integration.

The problem to be solved by the present invention is to provide a tunneling field effect transistor that can suppress ambipolar current without increasing the area occupied by one transistor.

The technical problems of the present invention are not limited to the technical problems mentioned above, and other technical problems not mentioned will be clearly understood by those skilled in the art from the description below.

Technical Solution

One aspect of the invention provides a tunneling field effect transistor. The tunneling field effect transistor comprises a semiconductor pattern disposed on a substrate and including a thin part at one end, a thick part at the other end, and a step between the thin part and the thick part. A drain electrode is disposed on the thin part, a source electrode is disposed on the thick part, and a gate electrode is disposed on the thick part between the drain electrode and the source electrode. A gate insulating layer is disposed between the semiconductor pattern and the gate electrode and between a sidewall of the step of the semiconductor pattern and the drain electrode. The semiconductor pattern has a drain region of a first conductivity type induced by generation of a charge plasma of the first conductivity type in an area adjacent to the drain electrode, and a source region of a second conductivity type induced by generation of a charge plasma of the second conductivity type in an area adjacent to the source electrode, and a channel region between the source region and the drain region. A thickness of the drain electrode is lower than a height of the step of the semiconductor pattern.

The drain electrode may be a metal electrode having a small work function compared to the work function of the semiconductor pattern adjacent thereto, the charge plasma of the first conductivity type may be an electron plasma, and the drain region of the first conductivity type may be an n-type drain region.

The drain electrode may include multiple layers of sub-drain electrodes. The sub-drain electrodes may include a lower sub-drain electrode and an upper sub-drain electrode. The sub-drain electrodes may include a lower sub-drain electrode, an upper sub-drain electrode, and a middle sub-drain electrode interposed between them. The higher a sub-drain electrode among the sub-drain electrodes is located, the smaller a difference between a work function of the sub-drain electrode and a work function of the semiconductor pattern adjacent to the sub-drain electrode may be.

The source electrode may be a metal electrode having a large work function compared to the work function of the semiconductor pattern adjacent thereto, the charge plasma of the second conductivity type may be a hole plasma, and the source region of the second conductivity type may be a p-type source region.

The gate insulating layer may have a thickness between a sidewall of the drain electrode and a sidewall of the step of the semiconductor pattern thinner than a thickness between the semiconductor pattern and the gate electrode.

One aspect of the invention provides a tunneling field effect transistor. The tunneling field effect transistor comprises a semiconductor pattern disposed on a substrate and including a thin part at one end, a thick part at the other end, and a step between the thin part and the thick part. A drain electrode is disposed on the thin part and having a small work function compared to a work function of the semiconductor pattern. A source electrode is disposed on the thick part and having a large work function compared to a work function of the semiconductor pattern. A gate electrode is disposed on the thick part between the drain electrode and the source electrode. A gate insulating layer is disposed between the semiconductor pattern and the gate electrode and between a sidewall of the step of the semiconductor pattern and a sidewall of the drain electrode. The semiconductor pattern has an n-type drain region induced by electron plasma generation in an area adjacent to the drain electrode, and a p-type source region induced by hole plasma generation in an area adjacent to the source electrode, and a channel region between the source region and the drain region. A thickness of the drain electrode is lower than a height of the step of the semiconductor pattern.

The drain electrode may have multiple layers of sub-drain electrodes, and the work functions of the sub-drain electrodes may increase as their location elevated. The sub-drain electrodes are two or three sub-drain electrodes that are sequentially stacked and have different work functions.

Advantageous Effects

According to the present invention described above, the generation of reverse current or ambipolar current can be suppressed without increasing the planar area occupied by one transistor. As a result, leakage current can be suppressed without reducing device integration.

However, the effects of the present invention are not limited to the effects mentioned above, and other effects not mentioned will be clearly understood by those skilled in the art from the description below.

DESCRIPTION OF DRAWINGS

FIG. 1 is a perspective view showing a tunneling field effect transistor according to an embodiment of the present invention, and FIG. 2 is a cross-sectional view taken along the cutting line 1B-1B' of FIG. 1.

FIG. 3 is a perspective view showing a tunneling field effect transistor according to another embodiment of the present invention, and FIG. 4 is a cross-sectional view taken along the cutting line 2B-2B' of FIG. 3.

FIG. 5 is a perspective view showing a tunneling field effect transistor according to another embodiment of the present invention, and FIG. 6 is a cross-sectional view taken along the cutting line 3B-3B' of FIG. 5.

MODES OF THE INVENTION

Hereinafter, in order to explain the present invention in more detail, preferred embodiments according to the present invention will be described in more detail with reference to the attached drawings. However, the present invention is not limited to the embodiments described herein and may be embodied in other forms. In the drawings, where a layer is referred to as being "on" another layer or substrate, it may be formed directly on the other layer or substrate, or there may be a third layer interposed between them. In the present embodiments, "first," "second," or "third" are not intended to impose any limitation on the components, but should be understood as terms for distinguishing the components.

FIG. 1 is a perspective view showing a tunneling field effect transistor according to an embodiment of the present invention, and FIG. 2 is a cross-sectional view taken along the cutting line 1B-1B' of FIG. 1.

Referring to FIGS. 1 and 2, a substrate 100 may be provided. The substrate may be a semiconductor substrate, a metal substrate, a glass substrate, or a flexible substrate. For example, the flexible substrate may be a polymer substrate, such as a polyethylene terephthalate (PET) or polyimide (PI) substrate. Elements for operation circuits, etc. may be formed on the substrate 100. Additionally, a protective layer 110, such as an insulating film, may be formed to cover the substrate or the device. The protective layer 110 may be a silicon oxide film, a silicon nitride film, or a composite layer thereof.

A semiconductor layer may be formed on the protective layer 110. The semiconductor layer may be a silicon layer. As an example, it may be a single crystalline silicon layer, a polycrystalline silicon layer, or an amorphous silicon layer. Specifically, it may be an epitaxially grown single crystalline silicon layer.

A semiconductor pattern 120 can be formed by patterning the semiconductor layer. The semiconductor pattern 120 may be formed so that one end thereof has a thinner thickness than the other end. To this end, when patterning the semiconductor layer, a halftone photomask may be used to form a photoresist pattern with steps on the semiconductor layer, and the semiconductor layer can be etched using this photoresist pattern.

A gate insulating layer 130 may be formed on the semiconductor pattern 120. The gate insulating layer 130 may be a silicon oxide layer, a silicon oxynitride layer, an aluminum oxide layer, an aluminum oxynitride layer, or a composite layer thereof. The gate insulating layer 130 may be formed on the upper surface of the thick part of the semiconductor pattern 120 and on the sidewall of the step between the thick part and the thin part of the semiconductor pattern 120. The gate insulating layer 130 may have a first thickness $t_1$ on the upper surface of the thick part of the semiconductor pattern 120 and a second thickness $t_2$ on the sidewall of the step, and the second thickness $t_2$ may be thinner than the first thickness $t_1$. To implement this, a physical vapor deposition or chemical vapor deposition method that does not have a very good step coverage can be used to form a gate insulating film, and the deposited gate insulating film can be patterned to form the gate insulating layer 130.

A drain electrode 161 may be formed on one end, that is, the thin portion of the semiconductor pattern 120. The drain electrode 161 may be a metal electrode whose work function is small compared to the work function of the semiconductor pattern 120 connected thereto. When the semiconductor pattern 120 is a silicon layer, the drain electrode 161 may include a metal which have a work function smaller than that of silicon, for example, a work function of 4.5 eV or less, specifically, a work function of 4.2 eV or less. The drain electrode 161 may include hafnium (Hf), indium (In), zirconium (Zr), thallium (Tl), tantalum (Ta), titanium (Ti), aluminum (Al), or a combination thereof. Due to the difference in work function between the semiconductor pattern 120 and the drain electrode 161, electrons can move from the drain electrode 161 to the semiconductor pattern 120, so that a drain region 121 of the first conductivity type, that is, an n-type may be induced in the semiconductor pattern 120 by a charge plasma of a first conductivity type, that is, an electron plasma, formed in the semiconductor pattern 120 adjacent to the drain electrode 161.

A source electrode 163 may be formed on the other end of the semiconductor pattern 120, that is, on the thicker part of the semiconductor pattern 120. The source electrode 163 may be a metal electrode having a work function larger than the work function of the semiconductor pattern 120 connected thereto. When the semiconductor pattern 120 is a silicon layer, the source electrode 163 may include a metal with a work function greater than silicon, for example, 5 eV or more. The source electrode 163 may include nickel (Ni), iridium (Ir), palladium (Pd), platinum (Pt), or a combination thereof. Due to the difference in work function between the semiconductor pattern 120 and the source electrode 163, electrons in the semiconductor pattern 120 can move to the source electrode 163. Therefore, a charge plasma of a second conductivity type, that is, a hole plasma, may be formed in the semiconductor pattern 120 adjacent to the source electrode 163, thereby inducing a source region 123 of a second conductivity type, that is, a p-type in the semiconductor pattern 120.

A gate electrode 140 may be formed on the gate insulating layer 130 between the drain electrode 161 and the source electrode 163. The gate electrode 140 may be formed on the upper surface of the thicker portion of the semiconductor pattern 120 and may be located between the drain electrode 161 and the source electrode 163. The gate electrode 140 may be formed using Al, Cr, Cu, Ta, Ti, Mo, W, or an alloy thereof.

The gate insulating layer 130 may be described as being disposed between the semiconductor pattern 120 and the gate electrode 140, and between the sidewall of the drain electrode 161 and the sidewall of the step of the semiconductor pattern 120. In addition, in the gate insulating layer 130, the thickness $t_2$ between the sidewall of the drain electrode 161 and the sidewall of the step of the semiconductor pattern 120 may be thinner than the thickness $t_1$ between the semiconductor pattern 120 and the gate electrode 140.

The area between the p-type source region 123 and the n-type drain region 121 may be an intrinsic semiconductor region and may be defined as a channel region 125. As described above, the p-type source region 123 and the n-type drain region 121 can be induced into a conductive region through charge plasma generation without impurity doping using ion implantation or the like. Here, the source region 123 is described as p-type and the drain region 121 as n-type. However, this is not limited to this, and the source region 123 can be formed as n-type and the drain region 121 as p-type. Accordingly, the drain region 121 may be defined as a region having a first conductivity type, and the source region 123 may be defined as a region having a second conductivity type opposite to the first conductivity type.

Inducing the source and drain regions into a conductive region through charge plasma formation due to the difference in work function between the source/drain electrodes and the semiconductor pattern rather than impurity doping such as ion implantation is a simple process compared to impurity doping such as ion implantation, and further can suppress defect generation in the semiconductor pattern.

The larger the gap between the gate electrode 140 and the drain electrode 161, the greater the tunneling width between the channel region 125 and the drain region 121 when a reverse voltage is applied to the gate electrode 140, thereby suppressing the generation of reverse current or ambipolar current. In this embodiment, the gap $h_3$ between the gate electrode 140 and the drain electrode 161 is made to appear in the thickness direction of the transistor, so that the generation of reverse current or ambipolar current can be suppressed without increasing the planar area occupied by one transistor compared to the case of expanding the planar gap between the gate electrode 140 and the drain electrode 161 to suppress the generation of reverse current or ambipolar current. As a result, leakage current can be suppressed without reducing device integration.

The gap $h_3$ between the gate electrode 140 and the drain electrode 161 may depend on the step height $h_1$ between the thick and thin parts of the semiconductor pattern 120 and the thickness $h_2$ of the drain electrode 161. Specifically, the thickness $h_2$ of the drain electrode 161 may be lower than the step height $h_1$ of the semiconductor pattern 120.

FIG. 3 is a perspective view showing a tunneling field effect transistor according to another embodiment of the present invention, and FIG. 4 is a cross-sectional view taken along the cutting line 2B-2B' of FIG. 3. The tunneling field effect transistor according to this embodiment is substantially the same as the tunneling field effect transistor described with reference to FIGS. 1 and 2, except as described later.

Referring to FIGS. 3 and 4, a drain electrode may be disposed on one end, that is, a thin portion of the semiconductor pattern 120. The drain electrode may include multi-layered sub-drain electrodes, as an example, and may include two-layered sub-drain electrodes 161*a* and 161*c*.

The sub-drain electrodes 161*a* and 161*c* may have different work functions, and a higher-positioned sub-drain electrode among the sub-drain electrodes 161*a* and 161*c* may have a work function that is less different from the work function of the semiconductor pattern 120. Specifically, when the semiconductor pattern 120 is a silicon layer, the sub-drain electrodes 161*a* and 161*c* may be formed using metals with a work function smaller than that of silicon, for example, a work function of 4.5 eV or less. Additionally, among the sub-drain electrodes 161*a* and 161*c*, the lower sub-drain electrode 161*a* may have a smaller work function than the upper sub-drain electrode 161*c*. As an example, the lower sub-drain electrode 161*a* may be formed using a metal having a work function of about 3.9 to 4.1 eV, and the upper sub-drain electrode 161*c* may be formed using a metal having a work function of about 4.1 to 4.5 eV. Specifically, the lower sub-drain electrode 161*a* can be formed using Hf, and the upper sub-drain electrode 161*c* can be formed using Ta, Ti, or a combination thereof.

As the difference between the work functions of the sub-drain electrodes 161*a* and 161*c* and the semiconductor pattern 120 increases, the charge plasma concentration formed in the semiconductor pattern 120 adjacent to the sub-drain electrodes 161*a* and 161*b* increases. In other words, compared to the charge plasma concentration in the drain region 121 formed by the lower sub-drain electrode 161*a*, the charge plasma concentration in the drain region 121 formed by the upper sub-drain electrode 161*c* may be lower. Accordingly, the tunneling width between the channel region 125 and the drain region 121 can be increased to further suppress the generation of reverse current or ambipolar current.

FIG. 5 is a perspective view showing a tunneling field effect transistor according to another embodiment of the present invention, and FIG. 6 is a cross-sectional view taken along the cutting line 3B-3B' of FIG. 5. The tunneling field effect transistor according to this embodiment is substantially the same as the tunneling field effect transistor described with reference to FIGS. 1 and 2, except as described later.

Referring to FIGS. 5 and 6, multi-layer sub-drain electrodes, for example, three-layer sub-drain electrodes 161*a*, 161*b*, and 161*c* may be formed on one end, that is, the thin portion of the semiconductor pattern 120.

The higher the sub-drain electrode is located among the sub-drain electrodes 161*a*, 161*b*, and 161*c*, the difference between its work function and the work function of the semiconductor pattern 120 adjacent to it may be smaller. Specifically, when the semiconductor pattern 120 is a silicon layer, the sub-drain electrodes 161*a*, 161*b*, and 161*c* may be formed using metals with a work function smaller than silicon, for example, a work function of 4.5 eV or less. In addition, among the sub-drain electrodes 161*a*, 161*b*, and 161*c*, the middle sub-drain electrode 161*b* may have a smaller work function than the upper sub-drain electrode 161*c*, and the lower sub-drain electrode 161*a* may have a smaller work function than the middle sub-drain electrode 161*b*. In other words, the work function may increase in the order of the lower sub-drain electrode 161*a*, the middle sub-drain electrode 161*b*, and the upper sub-drain electrode 161*c*. As an example, the lower sub-drain electrode 161*a* may be formed using a metal having a work function of about 3.9 to 4.1 eV, and the middle sub-drain electrode 161*b* may be formed using a metal having a work function of about 4.1 to 4.3 eV, and the upper sub-drain electrode 161*c* may be formed using a metal having a work function of about 4.3 to 4.5 eV. Specifically, the lower sub-drain electrode 161*a* may be formed using Hf, the middle sub-drain electrode 161*b* may be formed using Al, and the upper sub-drain electrode 161*c* may be formed using Ta, Ti, or a combination thereof.

As the difference between the work functions of the sub-drain electrodes (161*a*, 161*b*, and 161*c*) and the semiconductor pattern 120 increases, the concentration of charge plasma formed in the semiconductor pattern 120 adjacent to each sub-drain electrode (161*a*, 161*b*, and 161*c*) may be higher. In other words, the charge plasma concentration in the drain region 121 formed by the middle sub-drain electrode 161*b* may be lower than the charge plasma concentration in the drain region 121 formed by the lower sub-drain electrode 161*a* and also, the charge plasma concentration in the drain region 121 formed by the upper sub-drain electrode 161*c* may be lower than the charge plasma concentration in the drain region 121 formed by the middle sub-drain electrode 161*b*. In summary, the charge plasma concentration in the drain region 121 may decrease toward the top of the step of the semiconductor pattern 120. Accordingly, the tunneling width between the channel region 125 and the drain region 121 can be increased to further suppress the generation of reverse current or ambipolar current.

While the exemplary embodiments of the present invention have been described above, those of ordinary skill in the art should understood that various changes, substitutions and alterations may be made herein without departing from the spirit and scope of the present invention as defined by the following claims.

The invention claimed is:

1. A tunneling field effect transistor comprising:

a semiconductor pattern disposed on a substrate and including a thin part at one end, a thick part at the other end, and a step between the thin part and the thick part;

a drain electrode disposed on the thin part, a source electrode disposed on the thick part, and a gate electrode disposed on the thick part between the drain electrode and the source electrode; and a gate insulating layer disposed between the semiconductor pattern and the gate electrode and between a sidewall of the step of the semiconductor pattern and the drain electrode, wherein the semiconductor pattern has a drain region of a first conductivity type induced by generation of a charge plasma of the first conductivity type in an area adjacent to the drain electrode, and a source region of a second conductivity type induced by generation of a charge plasma of the second conductivity type in an area adjacent to the source electrode, and a channel region between the source region and the drain region, and wherein a thickness of the drain electrode is lower than a height of the step of the semiconductor pattern.

2. The tunneling field effect transistor of claim 1, wherein the drain electrode is a metal electrode having a small work function compared to a work function of the semiconductor pattern adjacent thereto, wherein the charge plasma of the first conductivity type is an electron plasma, and the drain region of the first conductivity type is an n-type drain region.

3. The tunneling field effect transistor of claim 1, wherein the semiconductor pattern is a silicon layer, and the drain electrode is the metal electrode of hafnium (Hf), indium (In), zirconium (Zr), thallium (Tl), tantalum (Ta), titanium (Ti), aluminum (Al), or a combination thereof.

4. The tunneling field effect transistor of claim 1, wherein the drain electrode includes multiple layers of sub-drain electrodes.

5. The tunneling field effect transistor of claim 4, wherein the multiple layers of sub-drain electrodes include a lower sub-drain electrode and an upper sub-drain electrode.

6. The tunneling field effect transistor of claim 5, wherein the lower sub-drain electrode is a metal electrode of Hf, the upper sub-drain electrode is a metal electrode of Ta, Ti, or a combination thereof.

7. The tunneling field effect transistor of claim 4, wherein the sub-drain electrodes include a lower sub-drain electrode, an upper sub-drain electrode, and a middle sub-drain electrode interposed between the lower sub-drain electrode and the upper sub-drain electrode.

8. The tunneling field effect transistor of claim 7, wherein the lower sub-drain electrode is a metal electrode of Hf, the middle sub-drain electrode is a metal electrode of Al, and the upper sub-drain electrode is a metal electrode of Ta, Ti, or a combination thereof.

9. The tunneling field effect transistor of claim 4, wherein the higher a sub-drain electrode among the multiple layers of sub-drain electrodes is located, the smaller a difference between a work function of the sub-drain electrode and a work function of the semiconductor pattern adjacent to the sub-drain electrode is.

10. The tunneling field effect transistor of claim 1, wherein the source electrode is a metal electrode having a large work function compared to a work function of the semiconductor pattern adjacent thereto, the charge plasma of the second conductivity type is a hole plasma, and the source region of the second conductivity type is a p-type source region.

11. The tunneling field effect transistor of claim 10, wherein the semiconductor pattern is a silicon layer, and the source electrode is a metal electrode of nickel (Ni), iridium (Ir), palladium (Pd), platinum (Pt), or a combination thereof.

12. The tunneling field effect transistor of claim 1, wherein the gate insulating layer has a thickness between a sidewall of the drain electrode and the sidewall of the step of the semiconductor pattern thinner than a thickness between the semiconductor pattern and the gate electrode.

13. A tunneling field effect transistor comprising:

a semiconductor pattern disposed on a substrate and including a thin part at one end, a thick part at the other end, and a step between the thin part and the thick part;

a drain electrode disposed on the thin part and having a small work function compared to a work function of the semiconductor pattern;

a source electrode disposed on the thick part and having a large work function compared to the work function of the semiconductor pattern;

a gate electrode disposed on the thick part between the drain electrode and the source electrode; and a gate insulating layer disposed between the semiconductor pattern and the gate electrode and between a sidewall of the step of the semiconductor pattern and a sidewall of the drain electrode, wherein the semiconductor pattern has an n-type drain region induced by electron plasma generation in an area adjacent to the drain electrode, and a p-type source region induced by hole plasma generation in an area adjacent to the source electrode, and a channel region between the source region and the drain region, and wherein a thickness of the drain electrode is lower than a height of the step of the semiconductor pattern.

14. The tunneling field effect transistor of claim 13, wherein the drain electrode has multiple layers of sub-drain electrodes, and work functions of the multiple layers of sub-drain electrodes increase as location elevated.

15. The tunneling field effect transistor of claim 14, wherein the multiple layers of sub-drain electrodes are two or three sub-drain electrodes that are stacked and have different work functions.

16. The tunneling field effect transistor of claim 13, wherein, in the gate insulating layer, a thickness between a sidewall of the drain electrode and a sidewall of the step of the semiconductor pattern is thinner than a thickness between the semiconductor pattern and the gate electrode.

* * * * *